United States Patent
Nicoltsios et al.

(10) Patent No.: US 8,755,163 B2
(45) Date of Patent: Jun. 17, 2014

(54) THREE-PHASE AC POWER CONTROLLER

(75) Inventors: Grammenos Nicoltsios, Vienna (AT); Heinz Pichorner, Pettendorf (AT)

(73) Assignee: Siemens Aktiengesellschaft, München (DE)

( * ) Notice: Subject to any disclaimer, the term of this patent is extended or adjusted under 35 U.S.C. 154(b) by 569 days.

(21) Appl. No.: 13/128,341

(22) PCT Filed: Sep. 10, 2009

(86) PCT No.: PCT/EP2009/061716
§ 371 (c)(1),
(2), (4) Date: May 9, 2011

(87) PCT Pub. No.: WO2010/052048
PCT Pub. Date: May 14, 2010

(65) Prior Publication Data
US 2011/0222201 A1    Sep. 15, 2011

(30) Foreign Application Priority Data
Nov. 10, 2008   (AT) .................. A 1745/2008

(51) Int. Cl.
*H01L 21/00*   (2006.01)
*H02H 9/04*    (2006.01)
*H01L 29/20*   (2006.01)

(52) U.S. Cl.
CPC . *H02H 9/04* (2013.01); *H01L 29/20* (2013.01)
USPC ............ 361/118; 307/90; 361/91.7; 363/131; 363/132; 363/56.12

(58) Field of Classification Search
CPC .................................. H02H 9/04; H01L 29/20
USPC ................................. 361/118, 91.7
See application file for complete search history.

(56) References Cited

U.S. PATENT DOCUMENTS
2008/0094021 A1    4/2008  Garza

FOREIGN PATENT DOCUMENTS

| | | |
|---|---|---|
| CN | 2759052 Y | 2/2006 |
| DE | 10003692 A1 | 8/2001 |
| EP | 0488201 A1 | 6/1992 |
| EP | 1203434 B1 | 4/2003 |
| JP | 7059255 A | 3/1995 |
| RU | 18027 U1 | 5/2001 |
| RU | 2326483 C1 | 6/2008 |
| SU | 1582308 A1 | 7/1990 |

*Primary Examiner* — Rexford Barnie
*Assistant Examiner* — Toan Vu
(74) *Attorney, Agent, or Firm* — Henry M. Feiereisen LLC

(57) ABSTRACT

A three-phase AC power controller has three strands, each having an input and an output. Five pairs of valves are connected antiparallel for rotating field reversal. The first input is connected to the first output by way of a first pair, the second input is connected to the second output by way of a second pair and to the third output by way of a third pair, and the third input is connected to the second output by way of a fourth pair and to the third output by way of a fifth pair. An RC half-branch is connected as a snubber circuit to each input and to each output. These RC half-branches are each interconnected via a transverse connection.

4 Claims, 2 Drawing Sheets

THREE-PHASE AC POWER CONTROLLER

CROSS-REFERENCES TO RELATED APPLICATIONS

This application is the U.S. National Stage of International Application No. PCT/EP2009/061716, filed Sep. 10, 2009, which designated the United States and has been published as International Publication No. WO 2010/052048 A1 and which claims the priority of Austrian Patent Application, Serial No. A1745/2008, filed Nov. 10, 2008, pursuant to 35 U.S.C. 119(a)-(d).

BACKGROUND OF THE INVENTION

The invention relates to a three-phase AC power controller comprising three strands, each having an input and an output with five pairs of valves connected in antiparallel for rotating field reversal, wherein the first input is connected to the first output by way of a first pair, the second input is connected to the second output by way of a second pair and to the third output by way of a third pair and the third input is connected to the second output by way of a fourth pair and to the third output by way of the fifth pair.

Three-phase AC power controllers are categorized as line-commutated converters At a constant frequency the voltage is variably adjusted For this purpose a pair of valves connected in antiparallel, especially thyristors, is arranged in each strand.

Three-phase AC power controllers with rotating field reversal generally comprise five pairs of antiparallel connected valves, as shown in FIG. 1. In such cases one pair is arranged in one strand and in the remaining two strands an input is connected in each case by way of one pair to each output of these two remaining strands. The first pair in the one strand is always activated, in the two remaining strands the activation of the valve pairs is in accordance with the desired direction of rotation of the rotating field. Either the second input is connected via the second pair to the second output and the third input via the fifth pair to the third output or the second input is connected via the third pair and the third input via the fourth pair to the second output.

To relieve the load on the individual strands, in accordance with the prior art, as shown in FIG. 2, an RC branch is arranged in parallel to each pair of valves consisting of a resistor and a series-connected capacitor. In such cases only three branches are ever under load at the same time. For a snubber circuit (another widely used expression is "load-relief circuit" or TSE circuit) of a three-phase AC power controller with rotating field reversal five resistors and five capacitors are thus required, with it being necessary to ensure that the heat arising in the resistors is adequately removed. This leads, especially for three-phase AC power controllers with a power greater than 40 kW, to a corresponding space requirement within the device structure.

The underlying object of the invention is to specify improvements compared to the prior art for a three-phase AC power controller of the type specified at the start.

SUMMARY OF THE INVENTION

Inventively this object is achieved by a three-phase AC power controller having three strands, with each strand having an input and an output. A first pair of antiparallel-connected valves is connected between the input of a first strand and the output of the first strand, a second pair of antiparallel-connected valves is connected between the input of a second strand and the output of the second strand, a third pair of antiparallel-connected valves is connected between the input of the second strand and the output of a third strand, a fourth pair of antiparallel-connected valves is connected between the input of the third strand and the output of the second strand, and a fifth pair of antiparallel-connected valves is connected between the input of the third strand and the output of a third strand. First RC half-branches are connected as a snubber circuit to each input of the three strands in one-to-one correspondence, and second RC half-branches are connected as a snubber circuit to each input of the three strands in one-to-one correspondence. The terminals of the first and second RC half-branches that are not connected to the respective inputs and outputs are connected to each other by way of a transversal connection. In such a snubber circuit there is load on all the resistors regardless of which valve pair is currently being activated. The space requirement for all resistors reduces by around 40% compared to the space requirement for the prior art.

In an advantageous embodiment of the invention the two RC half-branches of a strand are each formed from a capacitor in series with a resistor in each case. This makes possible a simple symmetrical structure with identical components.

It can however also be advantageous for the two RC half-branches of a strand to be formed in the manner in which a capacitor is connected to the respective input and the respective output and for a resistor which has a center tap for switching on the transversal connection to be arranged between the capacitors. This type of embodiment can allow a further saving in space.

It is especially advantageous for the strands to be designed to conduct a device current of at least 100 Amperes. Such three-phase AC controllers with at least 40-50 Kilowatts need to correspondingly large load relief resistors, which means that space-saving is especially significant.

BRIEF DESCRIPTION OF THE DRAWING

The invention is explained below by way of examples which refer to the enclosed figures. The schematic diagrams are as follows.

DETAILED DESCRIPTION OF PREFERRED EMBODIMENTS

Figure 1:
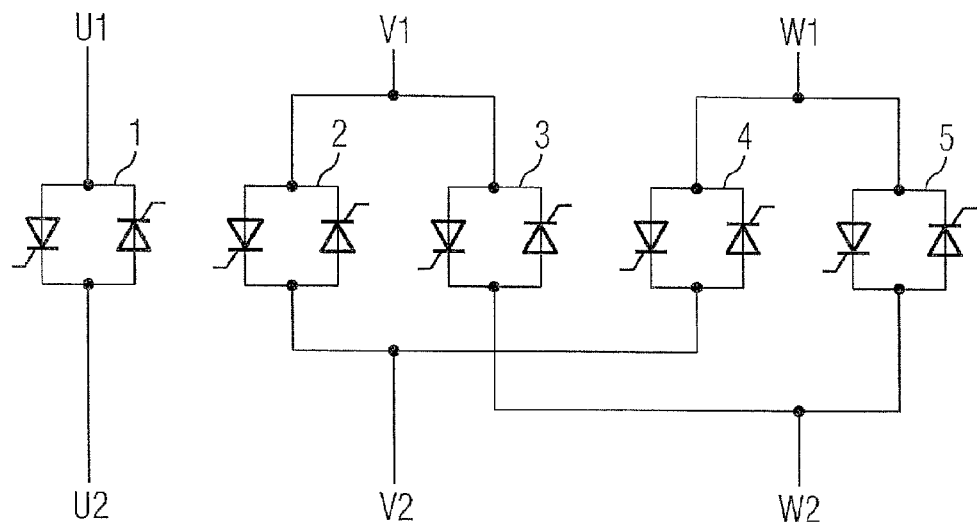
FIG. 1 Arrangement of the valve pairs of a three-phase A/C power controller with rotating field reversal.

As shown in FIG. 1, the three-phase AC power controller with three inputs U1, V1, W1 is able to be connected to the phases of an alternating current network. The first input U1 is connected by way of a first pair 1 of antiparallel switched valves to a first output U2 of the three-phase AC power controller. The valves of this first pair 1 are always activated independently of the desired direction of the reversing field.

The second input V1 of the three-phase AC power controller is connected via a second pair of antiparallel connected valves to a second output V2 and via a third pair 3 of antiparallel connected valves to a third output W2 of the three-phase AC power controller. The third input W3 is connected in the same way by two further pairs 4, 5 of antiparallel connected valves to the second and the third output V2, W2. The valves are normally embodied as thyristors with a corresponding phase angle firing control.

Depending on the desired direction of the rotating field, either the valves of the second and the fifth pair 2, 5 or of the third and the fourth pair 3, 4 are activated in operation.

Figure 2:
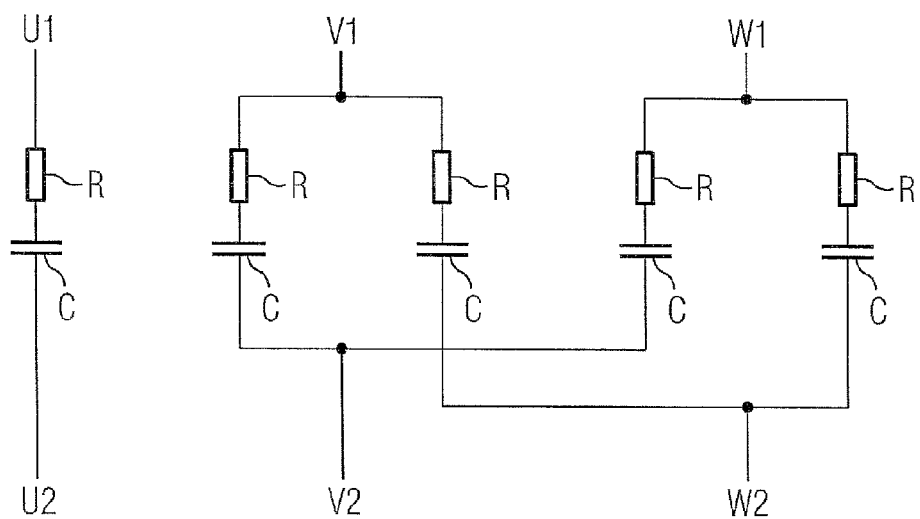
FIG. 2 Snubber circuit according to the prior art.

FIG. 2 shows a snubber circuit for the prior art valve pairs 1, 2, 3, 4, 5 depicted in FIG. 1. This figure shows an arrangement of five RC branches, each with a resistor R and a respective capacitor C, connected in series. Connected in parallel to each valve pair 1, 2, 3, 4, 5 is an RC branch. In operation the first RC branch which connects the first input U1 to the first output U2 is always under load. Depending on the selected direction of the rotating field, only two of the remaining four RC branches are under load, which are connected in parallel to the fired valve pairs 2, 5 or 3, 4.

Each RC branch in this known arrangement must accept the full load of a strand. The resistors R are to be dimensioned accordingly. The associated space requirement, taking into account a cooling concept, is a decisive factor in defining the size of the three-phase AC power controller.

Figure 3:
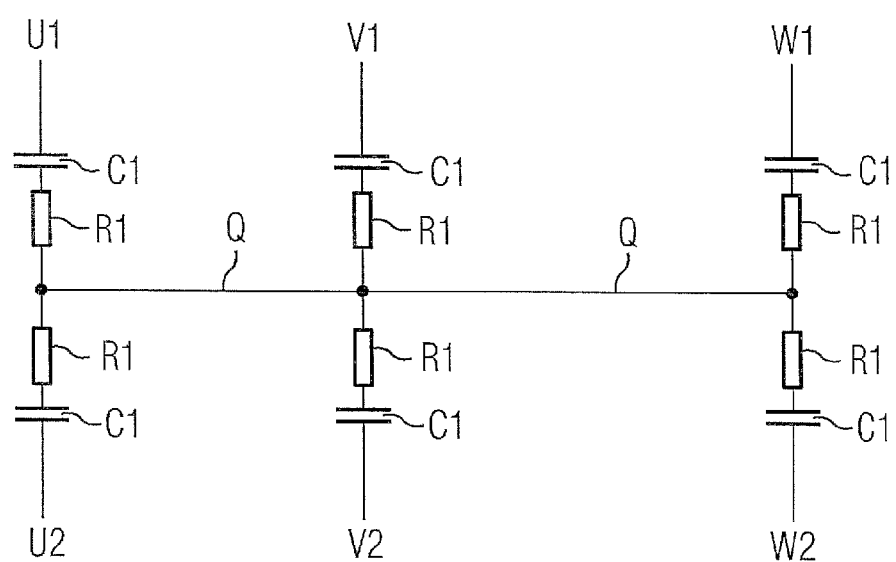
FIG. 3 Advantageous snubber circuit.

The snubber circuit shown in FIG. 3 allows the size of the three-phase AC power controller to be reduced by reducing the space required for the resistors R1 by around 40%. In this case the three RC branches are embodied as 6 RC half-branches which have a transversal connection Q. In operation each of these six half-branches is under load regardless of the direction of the rotating field.

Compared to the standard solution shown in FIG. 2, the resistance values of the individual resistors R1 is halved and the capacitances of the capacitors C1 is doubled in this way. However this does not increase the amount of space required for the capacitors C1, because the capacitor sizes primarily depend on the voltage load. The voltage load the two capacitors C1 of a strand remains unchanged compared to the voltage load of one capacitor C in FIG. 2. The space required for the two capacitors C1 of a strand thus roughly corresponds to the space required for one capacitor C in FIG. 2. The reduction of the resistance values, especially the reduction in the cross sections of the resistors R1 compared to the resistors R in FIG. 2, is thus fully exploited.

The structure of a RC half-branch can be adapted in any given way to a device layout. Either each RC half-branch is designed as a series circuit of resistors R1 and capacitors C1 or only one resistor is arranged for each strand which has a center tap for connecting the transversal connection Q. Naturally a number of resisters in series or a number of capacitors in parallel can also be connected within an RC half-branch, to withstand a load during operation.

The invention claimed is:

1. A three-phase AC power controller having three strands, with each strand having an input and an output, the AC power controller comprising:
    a first pair of antiparallel-connected valves connected between the input of a first strand and the output of the first strand,
    a second pair of antiparallel-connected valves connected between the input of a second strand and the output of the second strand,
    a third pair of antiparallel-connected valves connected between the input of the second strand and the output of a third strand,
    a fourth pair of antiparallel-connected valves connected between the input of the third strand and the output of the second strand,
    a fifth pair of antiparallel-connected valves connected between the input of the third strand and the output of a third strand,
    first RC half-branches connected as a snubber circuit to respective inputs of the three strands in one-to-one correspondence, and
    second RC half-branches connected as a snubber circuit to respective outputs of the three strands in one-to-one correspondence,
    wherein terminals of the first and second RC half-branches that are not connected to the respective inputs and outputs of the three strands are interconnected via a transverse connection.

2. The three-phase AC power controller of claim 1, wherein each of the first and second RC half-branches is formed by a capacitor connected in series with a resistor.

3. The three-phase AC power controller of claim 2, wherein in each strand a first terminal of the capacitor of the first RC half-branch is connected to a respective input and a first terminals of a capacitor of the second RC half-branch is connected to a respective output of the three strands, and wherein the resistors in the first and second RC half-branches in each strand are constructed as a single resistor connected between second terminals of the capacitors in that strand, wherein the resistor in each strand has a center tap, and wherein the center taps of all strands are interconnected via the transverse connection.

4. The three-phase AC power controller of claim 1, wherein each of the stands is designed to conduct a device current of at least 100 Amperes.

\* \* \* \* \*